(12) United States Patent
Ruffini

(10) Patent No.: US 6,636,987 B1
(45) Date of Patent: Oct. 21, 2003

(54) METHOD AND DEVICE FOR DETERMINING A SYNCHRONIZATION FAULT IN A NETWORK NODE

(75) Inventor: Stefano Ruffini, Stockholm (SE)

(73) Assignee: Telefonaktiebolaget LM Ericsson (publ), Stockholm (SE)

( * ) Notice: Subject to any disclaimer, the term of this patent is extended or adjusted under 35 U.S.C. 154(b) by 453 days.

(21) Appl. No.: 09/645,570

(22) Filed: Aug. 25, 2000

(30) Foreign Application Priority Data

Sep. 13, 1999 (DE) .......................... 199 43 790

(51) Int. Cl.$^7$ ................................ G06F 11/00
(52) U.S. Cl. ........................ 714/12; 713/503
(58) Field of Search .................. 714/12, 43, 55, 714/57; 713/503

(56) References Cited

U.S. PATENT DOCUMENTS

| | | | | |
|---|---|---|---|---|
| 3,555,194 A | * | 1/1971 | Goto ........................... | 370/507 |
| 4,419,633 A | * | 12/1983 | Phillips ........................ | 331/17 |
| 4,697,156 A | * | 9/1987 | Rudolph ...................... | 331/1 A |
| 5,978,929 A | * | 11/1999 | Covino et al. ............... | 713/503 |
| 6,044,092 A | * | 3/2000 | Jayawardena et al. ....... | 370/516 |
| 6,173,023 B1 | * | 1/2001 | Tanonaka et al. ........... | 375/357 |
| 6,327,666 B1 | * | 12/2001 | Langberg et al. ........... | 713/400 |
| 6,339,833 B1 | * | 1/2002 | Guo ............................ | 714/55 |
| 6,381,660 B1 | * | 4/2002 | Ito .............................. | 710/58 |
| 6,522,871 B1 | * | 2/2003 | Patrick et al. ............... | 455/256 |

FOREIGN PATENT DOCUMENTS

| | | |
|---|---|---|
| CA | 2217840 A | 4/1999 |
| JP | 60-237740 A | 11/1985 |
| JP | 03-175821 A | 10/1991 |
| JP | 05-292109 A | 11/1993 |
| JP | 07-66802 A | 3/1995 |
| JP | 07-74769 | 3/1995 |
| JP | 08-204695 | 8/1996 |
| WO | 98/18206 A | 4/1998 |

OTHER PUBLICATIONS

*IEEE Communications Magazine*, US, IEEE Service Center, Piscataway, N.J., vol. 27, No. 4, Apr. 1, 1989, J.E. Abate et al., "AT&T's New Approach to The Synchronization of Telecommunication Networks," pp. 33–45, XP000051483.

*IEEE Transactions on Ultrasonics, Ferroelectrics and Frequency Control*, US, IEEE Inc., New York, vol. UFFC–34, No. 6, Nov. 1, 1987, J.W. Pan, "Present and Future of Synchronization in the US Telephone Network," pp. 629–638, XP000674126.

*Proceedings of the 1993 IEEE International Frequency Control Symposium*, 1993 IEEE International Frequency Control Symposium, Salt Lake City, Utah, USA, Jun. 2–4, 1993, W. Su et al., "A new approach to clock modeling and Kalman filter time and frequency prediction," pp. 331–334, XP000972642.

* cited by examiner

Primary Examiner—Robert Beausoliel
Assistant Examiner—Bryce P. Bonzo
(74) Attorney, Agent, or Firm—Nixon & Vanderhye, P.C.

(57) ABSTRACT

The present invention relates to a method and device for determining a synchronization fault in a synchronization network, where values of a clock control parameter associated with the synchronization control in a node are compared with a predicted mask value for said clock control parameter, and a synchronization fault is determined if one or more of the measured values lies outside of the predicted mask.

15 Claims, 3 Drawing Sheets

METHOD AND DEVICE FOR DETERMINING A SYNCHRONIZATION FAULT IN A NETWORK NODE

BACKGROUND OF THE INVENTION

In the field of telecommunications it is known that the switching of signals in a digital network requires that there be a form of synchronization for all the nodes of the network. In order to accomplish the switching of digital signals in a network, the average rates of all the multiplex signals terminating on a switch in a node must be synchronized within some achievable bound, and the reference clock of the switch itself must be synchronized to the common rate of the incoming signals. Such a network is therefore typically considered as consisting of a traffic network and a synchronization network.

Synchronization networks are typically constructed by establishing a master-slave hierarchy of so-called stratum clocks, where each stratum corresponds to a different level of precision. For example, stratum 1 clocks are normally implemented with cesium beam technology of very high precision, whereas stratum 2, 3 and 4 clocks have progressively lower accuracy. Synchronization references are passed from higher performance master clocks to equivalent or lower performance slave clocks. It is possible to supply more than one reference to a given slave clock, where this slave clock can then decide which reference to synchronize with.

FIG. 2 shows a schematic example of a clock system having a phase locked loop (PLL) structure. More specifically, a reference signal 1 is compared with the output 3 from a voltage controlled oscillator (VCO) 5 in a comparator 4, and the comparator then outputs an appropriate VCO control value 2 (VCV) to the voltage controlled oscillator 5.

In order to cope with variations in frequency between different nodes, digital switches typically incorporate so-called slip buffers, which are able to buffer the data frames if there is a difference between the write clock frequency and the read clock frequency. If the frequency difference continues for a sufficient amount of time, the slip buffer will eventually overflow or underflow, which results in a packet or frame of data either being repeated or deleted at the output of the buffer. Such slip events can have a different impact on the traffic network, depending on what kind of data is being transported. For example, when transporting digital data that employs automatic retransmission request (ARQ), a slip will result in requests for retransmission and thus degraded throughput.

PROBLEMS UNDERLYING THE INVENTION

When problems occur in the traffic network, such as e.g. a degraded throughput, it is important to be able to identify the cause of the problems. The problems can be caused by specific failures in the traffic network or the synchronization network. If failures occur in the synchronization network, due for example to the creation of timing loops, which will lead to a high slip rate, then the effects on the traffic network can appear far away from the root in the synchronization network, i.e. where the synchronization failure occurred. Due to this fact, it is possible that a network operator will undertake a wrong action at a wrong place.

It is therefore important to provide network operators with a means that can assist in finding out if the synchronization network is the real cause of problems appearing in the traffic network, and in which node of the network the synchronization is not working.

The known solution to this object is to check the quality of the synchronization references with test instruments, and on a higher level, to analyze the network synchronization plan. One problem with test instruments is that in case of a strong impact of the failure (as it could e.g. occur during the millennium shift), it would take a long time and large effort to simultaneously check the quality of all of the synchronization references in all of the network nodes. This is very time and cost consuming in case of failures in wide area networks (WAN). Moreover, the use of test instruments is only feasible if the network nodes do not branch strongly and if the synchronization network is simple and flat.

OBJECT OF THE PRESENT INVENTION

The object of the present invention is to provide a device and method for determining a synchronization fault that is applicable to any type of synchronization network, and is simple to implement.

SUMMARY OF THE PRESENT INVENTION

This object is solved by the subject-matter of the independent claims. Advantageous embodiments are described in the dependent claims.

In accordance with the present invention, the actual values of a clock control parameter (such as the VCO control value VCV in FIG. 2) are measured and compared with the predicted behavior of said clock control parameter. The predicted behavior is based upon a model that takes into account internal factors leading to a deviation between the reference clock and the internal clock (such as drift and temperature variations), such that a discrepancy between the predicted behavior and the measured values indicates a synchronization fault caused by the synchronization network.

Although the prediction model can be entirely based on theoretical considerations, it is preferable that the prediction model be based on the collection of significant data during a predetermined observation period that precedes the measurement period during which the predicted behavior is compared with the actual behavior. This collecting of data is done by observing the clock control value in the node or nodes e.g. under conditions when the synchronization network is either known to be failure-free or can be assumed to be failure-free. Then the characteristic values of the model are determined on the basis of the observed values, to thereby be able to make a prediction. Typically this prediction will consist in calculating a mask or value range inside of which the clock control parameter should lie at a given future point in time. Then, if the measured values lies outside of this mask or value range, it is judged that a synchronization fault is present.

The method of the present invention can be implemented in such a way that it is only triggered when a specific failure event occurs in the traffic network, to thereby be able to identify if this is due to a failure in the synchronization network, and if yes, in which nodes the synchronization failure has occurred, or the present invention can also be implemented to operate continuously to thereby be able to give an alarm or warning as soon as a synchronization failure occurs in any given node of the network.

The various aspects and advantages of the present invention shall become more apparent when studying the detailed embodiments, which shall be described in connection with the figures.

DETAILED DESCRIPTION OF PREFERRED EMBODIMENTS

Figure 1:
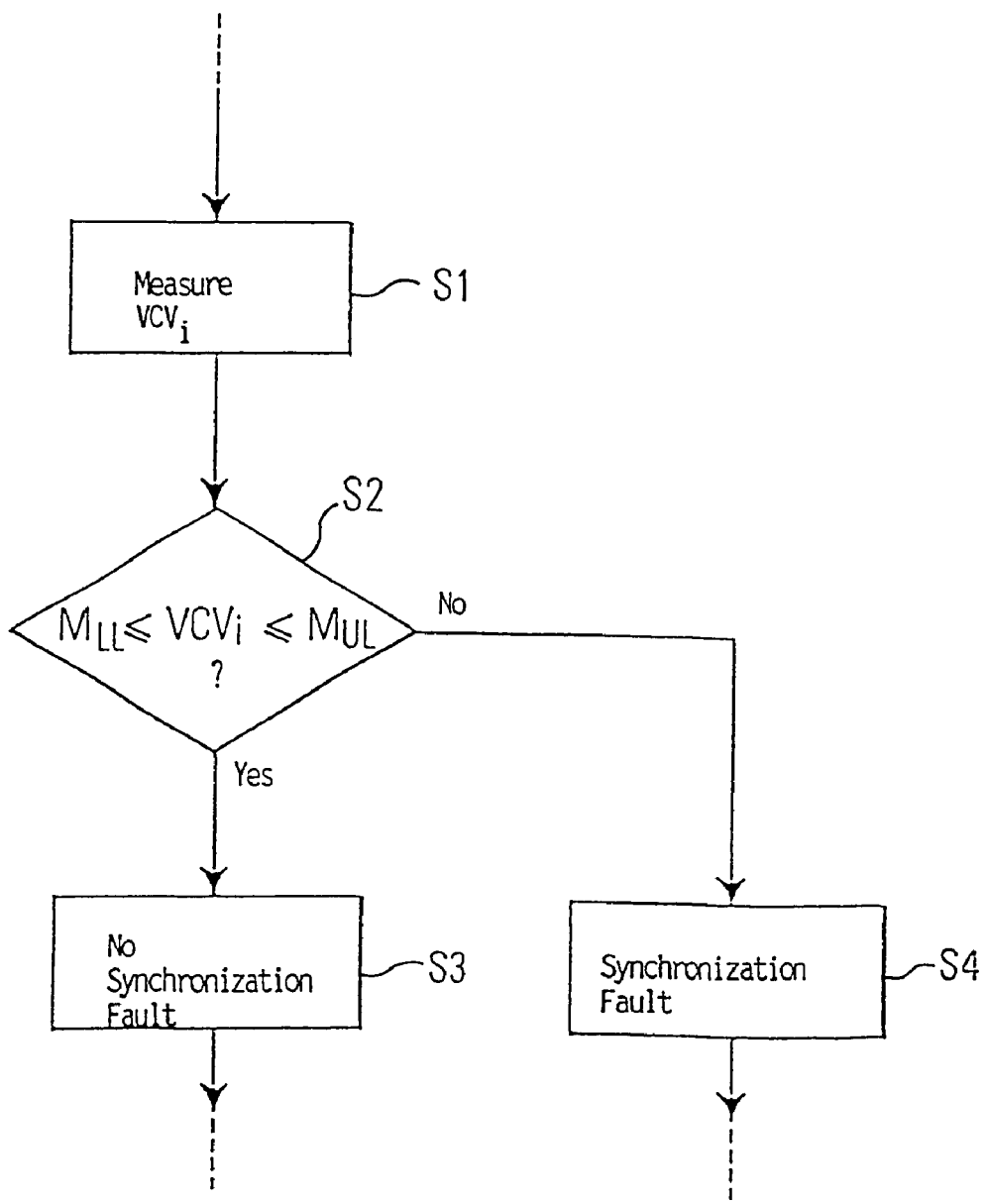
FIG. 1 shows a flow-chart of a basic embodiment of the present invention.

FIG. 1 shows a basic flow chart of an embodiment of the present invention, where a value of the VCO control value is measured in step S1 as $VCV_i$ ($VCV_i$ represents a sample value of $VCV(\tau)$, where $\tau$ represents the absolute time, and this sample value can e.g. be determined as $VCV_i=VCV(i\cdot\delta)$, where i is an integer and $\delta$ a sampling period) and then this sampled value $VCV_i$ is compared with a value range or mask having a mask lower limit $M_{LL}$ and a mask upper limit $M_{UL}$. The mask values $M_{LL}$ and $M_{UL}$ are calculated on the basis of a prediction model, where these values will generally also be time dependent, such the value $VCV_i$ is compared with mask values at the time $i\cdot\delta$. If the measured value $VCV_i$ lies inside of the value range, then it is judged that no synchronization fault has occurred (step S3), whereas if the value of $VCV_i$ lies outside of said value range, then it is judged that a synchronization fault is present (step S4). The processing after steps S3 or S4 is only shown as a number of dots, as this will depend on the specific application, and is of no further importance for the present invention.

It may be noted that in the example of FIG. 1, a synchronization failure is determined if only one value of VCV lies outside of the mask, but it is equally possible that the comparison step S2 is modified such that a synchronization fault is only judged to be present if a predetermined number of measured values $VCV_i$ fall outside of the mask. This can be seen as a mechanism against false alarms due to non-recurrent freak values.

The prediction model used to calculate the mask upper limit $M_{UL}$ and mask lower limit $M_{LL}$ can be selected in any desirable or appropriate way. For example, it can be based entirely on theoretical considerations associated with the clock or oscillator contained in the node in which the method of the invention is employed. Preferably, the model however combines theoretical considerations with empirical data to thereby be able to provide a simple but reliable way of predicting the behavior of the clock control parameter. More specifically, as shall be explained in detail in the following, it is preferable to use a linear approximation of the temporal behavior of the clock control parameter. However, it should be noted that naturally approximations of higher order or different type are equally well applicable.

Figure 3:
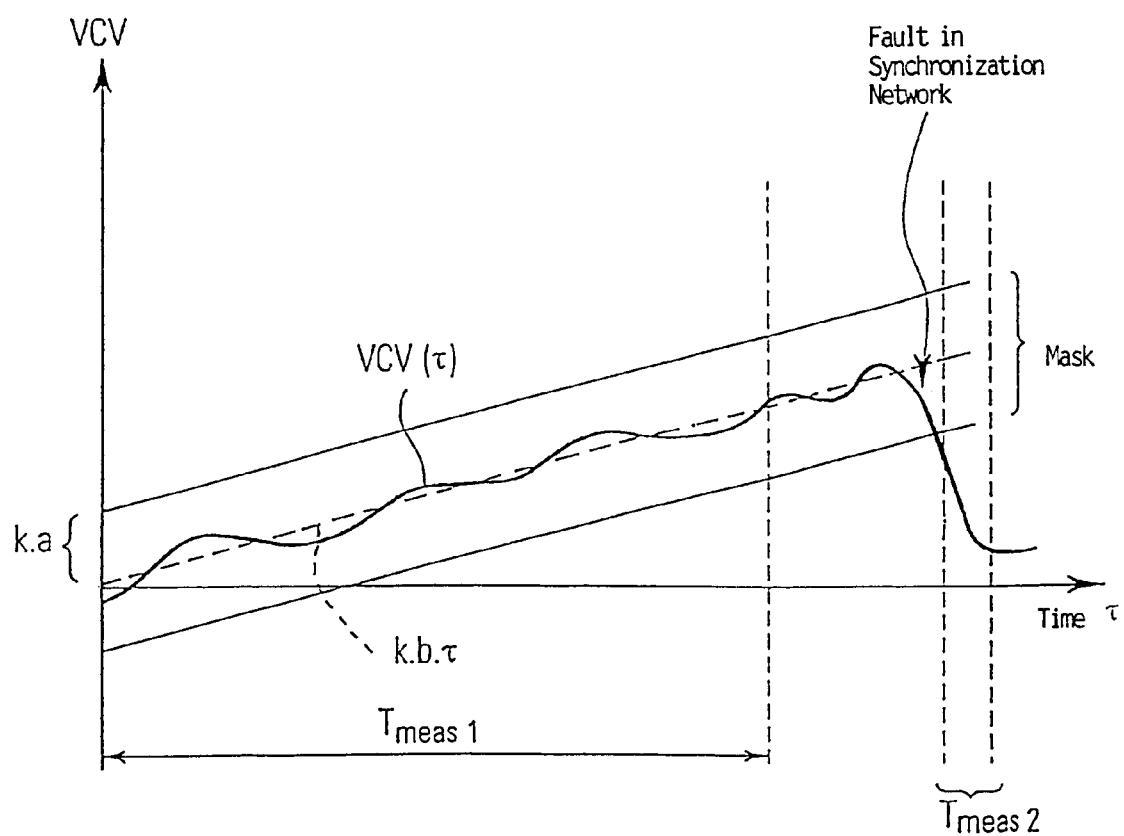
FIG. 3 is a graph that explains the method of the present invention.

FIG. 3 shows a graph, in which the behavior of the VCO control value VCV in the course of time $\tau$ is shown. In order to obtain a prediction mask, values of VCV are sampled during a first measurement period $T_{meas1}$. The length of the first measurement period and the rate of taking samples can be chosen as is appropriate for the specific application. For example, if the temperature at the node is an internal factor that influences the VCO control value VCV, then more than one sample per day should be collected in order to cover the expected temperature variation period. On the other hand, if the equipment is in a location having a controlled temperature (air conditioning, etc.), then a lower sample rate is possible. In order to cover the drifting characteristics of a voltage controlled oscillator, a total measurement period of several weeks is appropriate.

Additionally, a sufficiently large number of samples should be taken, in order to provide a good basis for statistics.

The measurement period $T_{meas1}$ can be chosen as covering a period of time in which the synchronization network is free of failure, or in which it can be expected that the synchronization network is free of failure. Such a situation will e.g. occur in connection with the millennium shift, i.e. the transition into the year 2000. In other words, the measurement period $T_{meas1}$ would be chosen to continue up until shortly prior to the millennium shift, i.e. until Dec. 30 or Dec. 31, 1999. Then the collection of data for modeling would be stopped and the steps of measuring values of VCV and comparing them to the mask range could be performed by way of monitoring, or as a response to a failure event in the traffic network.

Now a preferred model for the frequency deviation process will be described. The time error TE measured with respect to an ideal time generator (ideally locked to a UTC generator (UTC=Universal Time Coordinated)) after $\tau$ seconds is:

$$TE(\tau)=a\tau+0.5\ b\tau^2+c,$$

where the parameter a describes the initial frequency offset and phase error due to temperature variation, parameter b models the frequency drift of the clock, and parameter c models phase jumps due to transition (for example when entering a holdover mode). An additional term modeling the internal phase noise of the oscillator is considered as negligible in comparison with the other parameters.

The fractional frequency deviation (or offset) Y with respect to the nominal frequency $f_{nom}$ is defined as:

$$Y=(f-f_{nom})/f_{nom}.$$

In practice, the nominal frequency is a reference frequency with specified accuracy with respect to the actual nominal frequency.

The fractional frequency deviation can be evaluated by differentiating the time error TE:

$$Y(\tau)=a+b\tau.$$

Figure 2:
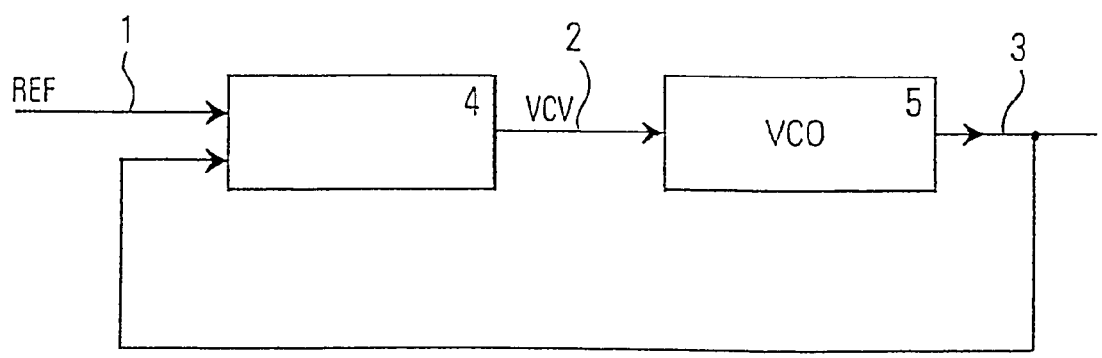
FIG. 2 is a schematic representation of a phase locked loop.

In practice, the VCO control value (or any appropriate related value) that is used for controlling the PLL (see e.g. FIG. 2) or any other similar oscillating controlled process, is directly related to the above formula for Y via a constant k, as in practice it shall accommodate the natural oscillating process of the controlled oscillator, in order to follow the ideal (under normal conditions) external synchronization reference.

The VCO control value VCV is therefore:

$$VCV=k\times Y(\tau)=k(a+b\tau).$$

In order to evaluate the linear term, a first derivative $\Delta$ (VCV) can be used, where $\delta$ will refer to the time interval between two samples $VCV_i$ in the following:

$$\Delta_j(VCV)=VCV_{i+1}-VCV_i=k(a_{i+1}+b(i+1)\delta)-k(a_i+bi\beta)=k(a_{i+1}-a_i)+b\beta.$$

By averaging the values $\Delta_j$ (VCV), the part relating to k ($a_{i+1}-a_i$) can be averaged away to zero, as it can be assumed that the variations due to temperature and other ambient causes have a zero mean value, and the parameter b can be evaluated.

By comparing the term $b\delta$, with the $VCV_i$ values, a maximum expected value for the parameter a can be determined. More specifically, on the basis of the determined value b, the values $a_i$ can be averaged to provide a value a, or the maximum value from all encountered values $a_i$ can be selected as the value a for the model. Naturally, any other suitable evaluation of the values $a_i$ is equally well possible.

With the above-mentioned parameters a and b, a prediction value range or prediction mask for VCV can be constructed. This mask, which is indicated in FIG. 3 as being centered around kbτ with a width of 2 ka, is used as a reference during a second measurement period $T_{meas2}$, where the method shown in FIG. 1 is performed during said second measurement period $T_{meas2}$. In other words, during said second measurement period values of VCV are measured, where it should be noted that these values $VCV_i$ shall be sampled at a higher rate than during the first measurement period $T_{meas1}$. Then, if a predetermined number of values $VCV_i$ (e.g. one) lie outside of the mask, i.e. $VCV_i \geq M_{UL}$ or $VCV_i \leq M_{LL}$, then an alarm signal is output that indicates a synchronization fault and identifies the node in which the synchronization fault has been detected. As already mentioned previously, the second measurement period $T_{meas2}$ can be triggered by the occurrence of a failure in the traffic network (as indicated in FIG. 3), or can be triggered regularly or periodically as a means for monitoring the behavior of the clock control parameter in order to immediately be able to identify a network synchronization failure when it occurs.

In the case of FIG. 3, the width of the mask is determined by a parameter a that results from the measurements during the first measurement period $T_{meas1}$. It is however equally well possible to only deduce the parameter b from the measurements, in order to provide the time dependent factor kbτ, and to select a constant value for the width of the mask.

As already mentioned earlier, it is possible to select the first measurement period $T_{meas1}$ and the second measurement period $T_{meas2}$ in view of a specific event that can be expected to cause problems in the network, such as the millennium transition from Dec. 31, 1999 to Jan. 1, 2000. For example, the first measurement period could be chosen as one month from Dec. 1, 1999 to Dec. 31, 1999 at 11 p.m., and the second measurement period could be chosen as from 11:30 p.m. on Dec. 31, 1999 to 12 noon on Jan. 1, 2000.

However, it is also possible to implement the method and device of the present invention such that a continuous measuring with respect to the first measurement period is conducted, to thereby achieve a continuous updating of the model parameters, e.g. the parameters a, b described above. For this purpose, the method of the invention is implemented in such a way that the length of the measurement period $T_{meas1}$ is fixed to a given value, e.g. one week, and a given mask or value range is associated with each measurement period $T_{meas1}^i$. The mask or value range is identified by the relevant parameters, such as a, b derived from the corresponding measurement period. Then, after the expiration of the given measurement period $T_{meas1}^i$, a new measurement period $T_{meas1}^{i+1}$ is started for the purpose of updating the parameters a, b. During this subsequent period $T_{meas1}^{i+1}$, the determination of a synchronization fault in accordance with the method described in connection with FIG. 1 is conducted on the basis of the mask associated with measurement period $T_{meas1}^i$. Then, when the period $T_{meas1}^{i+1}$ has expired, the values of a, b are updated in accordance with the results of said measurement period, and a further measurement period $T_{meas1}^{i+2}$ is started. This process is then continued as long as the continuous monitoring and updating is desired.

In other words, the method is implemented such that each first measurement period $T_{meas1}^i$ that is used to determine a mask value (e.g. in terms of parameter a, b) is associated with a second measurement period $T_{meas2}^i$ during which the measured values of VCV are compared with the mask associated with $T_{meas1}^i$, where $T_{meas2}^i$ begins after $T_{meas1}^i$ has expired. However, as a new first measurement period $T_{meas1}^{i+1}$ begins after $T_{meas1}^i$, the second measurement period $T_{meas2}^i$ will typically fall into this subsequent first measurement period $T_{meas1}^{i+1}$. As already mentioned, the mask to be used during the period $T_{meas2}^i$ will be the one determined on the basis of the measurement during $T_{meas1}^i$. However, as a measure of security, if the time difference between the occurrence of the condition that triggers the begin of $T_{meas2}^i$ (such as a predetermined fault condition in the traffic network, or a periodically recurring trigger signal) and the end of $T_{meas1}^i$ (i.e. the most recent first time period for which model parameters for mask determination were stored) is smaller than a predetermined limit, then the step of comparing values VCV with the mask will be done on the basis of the mask associated with the measurement period $T_{meas1}^{i-1}$, i.e. the first measurement period immediately preceding $T_{meas1}^i$.

This security measure is especially important if the begin of the second measurement period $T_{meas2}^i$ cannot be determined in advance, e.g. if it is triggered by a failure event in the traffic network. If the distance is too short, there is a danger that the mask is already influenced by the failure. Naturally, if the second measurement periods $T_{meas2}^i$ are started automatically and regularly, then the time span between the end of $T_{meas1}^i$ and the begin of $T_{meas2}^i$ can be adjusted appropriately.

In the following, a detailed example of the application of the present invention to a system clock of a digital exchange when preparing for the millennium shift will be given.

The control value of the system clock of the digital exchange has the default value of 2048, and it changes in units of 300 for every ppm of frequency adjustment. If the system clock is an ANSI stratum 3E clock, then it typically drifts no more than $10^{-3}$ ppm per day, i.e. 3 control units every 10 days. The maximum variation due to temperature variations should be less than $10^{-2}$ ppm, but in a temperature controlled environment we should expect a much better behavior, e.g. $0,3 \times 10^{-2}$ ppm corresponding to 1 control unit.

The first measurement period $T_{meas1}$ should start on Dec. 1, 1999. After 30 days measurement, the value could be e.g. 9 +/−1 control unit over/under the starting point. Whatever it will be, a mask can be defined based on the collected data as described previously. If something happens (e.g. a timing loop) in the synchronization network, and the synchronization reference changes suddenly, such that the frequency changes by a quantity of e.g. $10^{-1}$ ppm, slips will occur with the periodicity of about 1 every 20 minutes. After a few hours, e.g. 10 hours, this could create an unacceptable performance degradation in the network, e.g. if the traffic network is a signaling network, it could stop working.

The automatic check procedure triggered by this degradation will then start in all of the network nodes, finding the system clock control value at a value that is well outside the expected (predicted) mask only in those nodes where the synchronization is actually degraded. On the other hand, if the cause of errors in the network (e.g. congestion) is not due to synchronization problems, no mask will be exceeded in the network, and it will thereby be clear that the problems in the traffic network are not due to problems in the synchronization network, and consequently no false action will be taken, at least not with respect to the synchronization network.

As already mentioned, the check procedure during the second measurement period $T_{meas2}$ could alternatively be started before any failure is found, in order to prevent the failure from having a large effect, as it could be immediately detected.

The above-described method and device has a number of advantages. For example, a fault or failure in a network element due to bad synchronization can be found quickly and with little effort. Also, the above-described method is particularly suited for determining errors in a synchronization network when problems can be expected at a certain point in the future (e.g. the millennium shift).

Although the present invention has been described on the basis of specific embodiments, these embodiments are only presented to more clearly describe the character of the invention to the person skilled in the art, and are not to be seen as limiting the present invention, which is defined in its scope by the appended claims.

What is claimed is:

1. A method for determining a synchronization fault in at least one node of a network, said network comprising a traffic network and an associated synchronization network, where said synchronization network supplies network synchronization information to said node, said method comprising:

measuring values of a clock control parameter associated with synchronization control in said node, said clock control parameter depending on internal factors associated with said node and on said network synchronization information, comparing said measured values with a value range calculated on the basis of a prediction model of said clock control parameter, in order to determine if said measured values lie in said value range, where said prediction model takes into account said internal factors, and determining a synchronization fault in said node if a predetermined number of measured values lies outside of said value range.

2. The method according to claim 1, wherein said method is implemented to continuously perform the procedure of determining a synchronization fault in one or more of the nodes of said network, where an alarm signal identifying a node with a synchronization fault is output if a synchronization fault is determined.

3. The method according to claim 1, wherein said method is implemented to perform the procedure of determining a synchronization fault in all of the nodes of the network if a predetermined failure event occurs in the traffic network, where an alarm signal identifying a node with a synchronization fault is output if a synchronization fault is determined.

4. The method according to claim 1, wherein said clock control parameter is a control parameter for a local oscillator (VCO).

5. The method according to claim 4, wherein said oscillator is a voltage controlled oscillator in a phase locked loop, and said clock control parameter is the control voltage of said oscillator.

6. The method according to claim 4, wherein one of said internal factors is the drift of said oscillator.

7. The method according to claim 1, wherein one of said internal factors is the temperature.

8. The method according to claim 1, wherein said prediction model is based on observing said clock control parameter over a predetermined period of time ($T_{meas1}$) under fault-free operation conditions of said synchronization network.

9. The method according to claim 8, wherein said method is implemented such that said predetermined period of time lies prior to a point in time at which a synchronization fault is expected, and said determining of a synchronization fault is performed during a second period of time in which said point in time lies.

10. The method according to claim 1, wherein said prediction model is based on continuously observing said clock control parameter, where after each lapse of a predetermined time interval, new model parameters for calculating a value range to be used in said comparison step is calculated and stored, said new model parameters being associated with the most recently lapsed time interval.

11. The method according to claim 10, wherein said step of comparing measured values with a value range is triggered by the occurrence of a predetermined condition in said network, where the value range used in said comparison step is calculated from the most recently stored model parameters, except if the time difference between the occurrence of said predetermined condition and the end of the time interval with which said most recently stored model parameters is associated is smaller than a predetermined limit, in which case the stored model parameters immediately preceding said most recently stored model parameters are used for determining the value range used in said comparison step.

12. The method according to claim 11, wherein said predetermined condition is a prespecified failure event in said traffic network.

13. The method according to claim 11, wherein said predetermined condition is a regularly recurring trigger signal, such that said comparison step is performed regularly.

14. A fault determination device for a node of a network, said network comprising a traffic network and an associated synchronization network, comprising:

a synchronization control device that is arranged to receive network synchronization information from said synchronization network and to synchronize actions in said node with said network synchronization information, comprising a clock device that is controlled by a clock control parameter, said clock control parameter depending on internal factors associated with said node and on said network synchronization information, a measuring device for measuring values of said clock control parameter, a calculating device for calculating a value range on the basis of a prediction model of said clock control parameter where said prediction model takes into account said internal factors, a comparing device for comparing said measured values with said value range, in order to determine if said measured values lie in said value range, and a fault determining device for determining a synchronization fault in said node if a predetermined number of measured values lies outside of said value range.

15. A method for determining a synchronization fault in at least one node of a network, said network comprising a traffic network and an associated synchronization network, where said synchronization network supplies network synchronization information to said node, said method comprising:

measuring values of a control voltage of a voltage controlled oscillator that is arranged in a phase locked loop for performing synchronization control in said node, said control voltage depending on internal factors associated with said node and on said network synchronization information, comparing said measured values with a value range calculated on the basis of a prediction model of said control voltage, in order to determine if said measured values lie in said value range, where said prediction model takes into account said internal factors, and determining a synchronization fault in said node if a predetermined number of measured values lies outside of said value range.

* * * * *